United States Patent [19]
Langan

[11] 3,757,236
[45] Sept. 4, 1973

[54] BAND PASS FILTER AND DETECTION CIRCUIT

[75] Inventor: Marion J. Langan, Huntsville, Ala.

[73] Assignee: Avco Corporation, Huntsville, Ala.

[22] Filed: Dec. 17, 1971

[21] Appl. No.: 209,053

[52] U.S. Cl. .................. 328/167, 179/1 P, 329/134, 333/17
[51] Int. Cl. .......................... H04b 3/04, H04b 1/10
[58] Field of Search ...................... 333/17; 328/167; 325/458, 477, 474; 179/1 P; 329/134

[56] References Cited

UNITED STATES PATENTS

| | | | |
|---|---|---|---|
| 2,589,723 | 3/1952 | Miller | 333/17 |
| 3,611,165 | 10/1971 | Hills | 325/458 |
| 3,588,716 | 6/1971 | Turner | 328/167 |
| 2,976,408 | 3/1971 | Colaguori | 333/17 X |

*Primary Examiner*—Alfred L. Brody
*Attorney*—Charles M. Hogan

[57] ABSTRACT

There is herein disclosed a combination involving a limiter, a first active high pass filter, and a level detector in cascade. The first high pass filter is paralleled by an arrangement of second active high pass filter and inhibit circuit in cascade. The first filter accepts frequencies above a first cut-off point and the second filter accepts frequencies above a higher cut-off point and the output of the inhibitor is used to inhibit the output of the first filter. The result is a band pass detector which responds to frequencies within the range defined by the cut-offs.

2 Claims, 4 Drawing Figures

INVENTOR.
MARION J. LANGAN
BY Charles M. Hogan
ATTORNEY.

BAND PASS FILTER AND DETECTION CIRCUIT

BACKGROUND OF THE INVENTION AND OBJECTS

The conventional method employed for the detection of radio frequency signals within a specified band pass is to provide a circuit tuned to respond to or amplify frequencies within the specified band pass and to reject or attenuate frequencies above and below the specified band pass. A level detector is then employed to respond to the output of the tuned circuit whenever a specific voltage threshold is exceeded. This technique is illustrated in FIG. 1 below wherein the level detector responds when the voltage level is above the value designated "X" thus indicating that the applied signal is between the two frequencies designated by the dashed lines.

The above described conventional approach has a number of limitations that make detection of a precise frequency band extremely difficult particularly where the applied signal amplitude may be expected to have a large dynamic range. Considering FIG. 1, if the overall signal amplitude changes, the points of the curve designated X will change, thus providing a change in the width of the frequency band that activates the detector. The two approaches employed to counteract this effect are: (1) The provision of an automatic gain control circuit to maintain a constant level input to the tuned circuit, and (2) Making the Q of the tuned circuit very high so that the variation in voltage output versus a small frequency change is very high, thus minimizing the relative error attributed to changed in input amplitude.

Each of the above approaches is difficult to implement. A high Q circuit, particularly at low frequencies, involves either very large passive components or sophisticated active circuits. An automatic gain control (AGC) requires a certain amount of time to respond and the previously described level detector must be inhibited from responding prior to stabilization by the AGC circuit. Another problem may be encountered if very large signals result in hard limiting which produces frequency components that may evoke an erroneous response from the tuned circuit.

With reference to the use of an automatic gain control circuit, the response time involved precludes accurate detection of bursts of frequencies of varying amplitudes and of a shorter time duration than that required for the AGC and filter circuit to achieve stability.

A primary object of the invention, therefore, is to provide a simple, more efficient and accurate system for the detection of radio frequencies within a specific band pass. It will be understood that the parameters mentioned in the preferred embodiment described below are furnished by way of illustration and not of limitation.

For a better understanding of the invention, together with other objects, advantages and capabilities thereof, reference is made to the following description of the accompanying drawings.

BRIEF DESCRIPTION OF THE INVENTION

Figure 2:
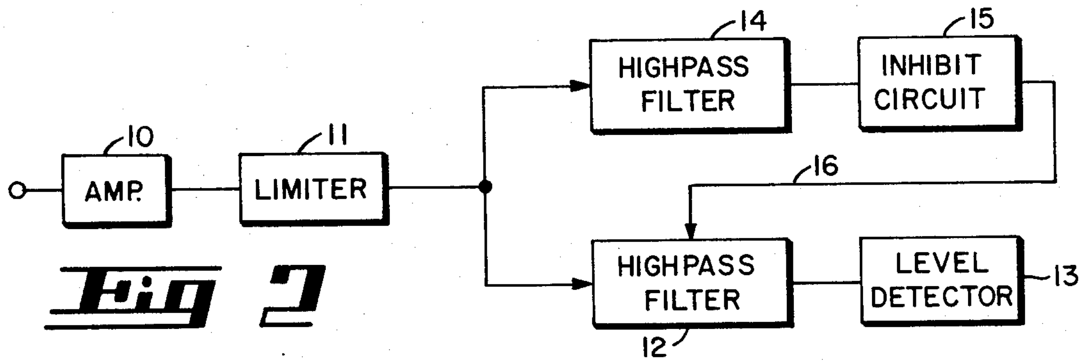
FIG. 2 is a block diagram of the filter-detector system in accordance with the invention.

FIG. 2 comprises the cascaded combination of amplifier 10, limiter 11, high pass filter No. 1, designated by the reference numeral 12, and a level detector 13. The high pass filter No. 1 is paralleled by high pass filter No. 2, designated by the reference numeral 14. Filter 14 is coupled to an inhibit circuit 15, the output of which is applied, via line 16, to inhibit the operation of the high pass filter 12.

In normal operation, high pass filter 12 is designed to reject all frquencies below lowest acceptable frequency. By way of example, assume this frequency to be 1,000 cycles per second. High pass filter 14 is designed to reject all frequencies below the highest acceptable frequency. By way of example, assume this frequency to be 1,100 cycles per second It is the function of high pass filter 14 to supply an input to the inhibit circuit 15, which inhibits the output from high pass filter 12. With this combination of circuitry, frequencies below 1,000 cycles per second will be rejected by both filter 12 and filter 14. Frequencies above 1,000 cycles per second and below 1,100 cycles per second will activate filter 12 but not filter 14, thus producing a response from the level detector. Frequencies above 1,100 cycles per second will activate both filter 12 and filter 14 but the output of filter 14 supplies an input to the inhibit circuit 15, which inhibits the output of filter 12, thus preventing a response from the level detector 13. The net result of the total circuit is a response for frequencies between 1,000 and 1,100 cycles per second and no response for frequencies below 1,000 or above 1,100 cycles per second. Before proceeding to a detailed explanation of the circuitry it may be observed that the circuitry of FIG. 2 may be used to accept all frequencies above and reject all frequencies below 1,000 cycles per second by deleting high pass filter 14 and the associated inhibit circuit 15.

Figure 3:
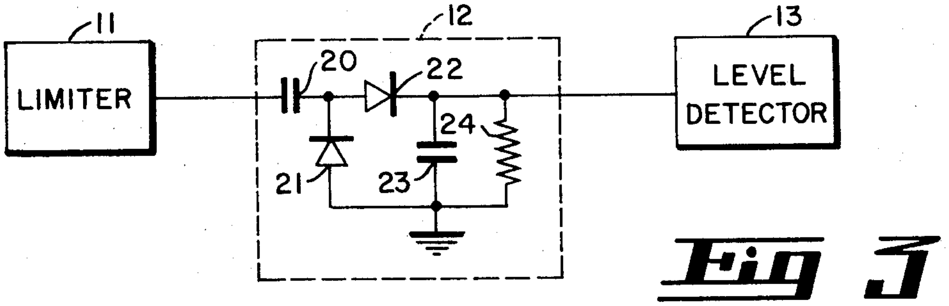
FIG. 3 is a circuit diagram of a preferred form of filter suitable for installation in the FIG. 2 embodiment.

The filter circuit of FIG. 3 functions as follows: The output of the limiter 11 is a square wave as typified by the output of a transistor that is driven between cut-off and saturation. The amplitude of the square wave is established by the source potential of the limiter output transistor. On the negative excursion of the output, series capacitor 20 is rapidly charged through the low forward impedance of shunt diode 21. On the positive excursion of the limiter output, capacitor 23 is charged in the opposite polarity through the low forward impedance of diode 22. By making the value of capacitor 23 large with respect to capacitor 20, only a small increment of charge accumulates on capacitor 23 for each limiter output cycle.

If resistor 24 is considered to be infinite in value and likewise the input resistance of the level detector 13 and the back resistance of diode 22 are essentially infinite, a positive voltage will eventually be established at the junction of capacitor 23 and diode 22 that is a function of the peak-to-peak output of the limiter and the forward voltage drops of diodes 21 and 22. The ratio of capacitance 23 to capacitance 20 will establish the number of cycles required to reach this maximum value. If the level detector is designed to respond to some voltage below this maximum level, a response will eventually take place regardless of the limiter output frequency. If now resistance 24 is reduced in value such as to discharge capacitor 23, very low frequencies will fail to accumulate a charge on capacitor 23 of a value that is adequate to activate the level detector. If, however, the limiter output frequency is very high, and resistance 24 is not extremely small, a charge will build up on capacitor 23 more rapidly than it is bled off by resistor 24 and a level detector response will be obtained. Obviously, by adjustment of resistor 24, an exact condition may be established wherein frequencies below a desired value will not activate the level detector and frequencies above this value will activate the level detector.

Figure 1:
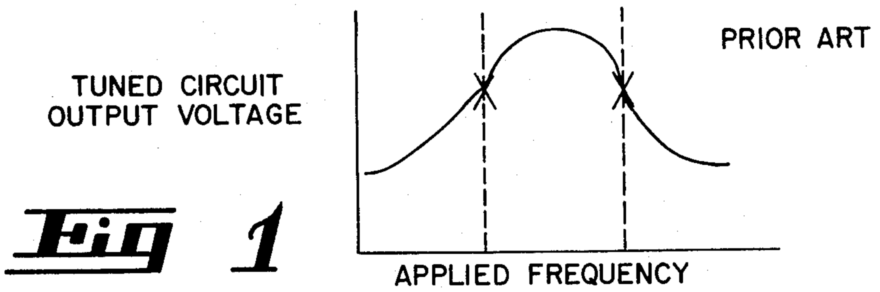
FIG. 1 is a graph explaining the operation of a prior art system of frequency detection.
Figure 4:
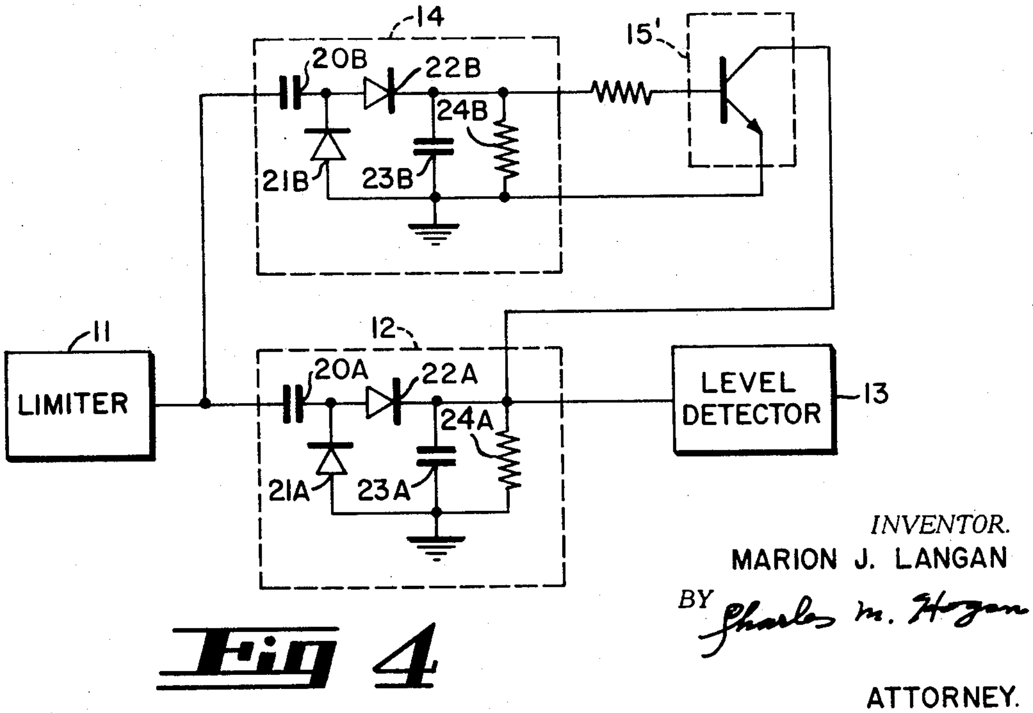
FIG. 4 is a circuit diagram of the FIG. 2 embodiment, incorporating filters in accordance with FIG. 3 and a transistorized inhibit circuit.

FIG. 4 illustrates a detecting system in accordance with FIG. 1 having a pair of filters 12 and 14, each in accordance with FIG. 2. In FIG. 4 the inhibitor circuit 15' comprises a transistor. The level detector responds to frequencies above the cut off frequency of the filter 12 and below the cut off frequency of the filter 14. In order to produce a response from level detector 13, the input frequency must be high enough to cause the charge on capacitor 23A (FIG. 4) to exceed the threshold of the level detector and low enough to cause the charge on capacitor 23B to be below the threshold of the transistor 15'.

Suitable parameters for the FIG. 3 filter circuit are as follows:

| | |
|---|---|
| Limiter Output | 4 volts peak-to-peak |
| Capacitor 20 | 0.015 microfarad |
| Capacitor 23 | 0.05 microfarad |
| Resistor 24 | 20,000 ohms |
| Diode 21 | Type 1N914 |
| Diode 22 | Type 1N914 |
| Level Detector Threshold | 1.4 volts |
| Frequency | 1000 cycles |

While there has been shown and described what is at present believed to be the preferred embodiment of the invention, it will be understood by those skilled in the art that various changes and modifications may be made therein without departing from the scope of the invention as defined in the appended claims.

Having described my invention, I claim:

1. A band pass network which is adapted to be coupled to the output of a source of signals to pass an acceptable range of frequencies comprising:

a first active high pass filter proportioned to reject all frequencies below the lowest acceptable frequency, a second active high pass filter designed to reject all frequencies below the highest acceptable frequency, said active filters having inputs connected in parallel to the output of the source of signals and also having separate outputs, said first filter also having a second input, means intercoupled between the output of the second filter and the input of the first filter for inhibiting the operation of the first filter when frequencies in excess of the highest acceptable frequency are being applied, and a level detector having an input coupled to the output of said first filter.

2. The combination in accordance with claim 1 and including a signal source proportioned to supply square waves.

* * * * *